(12) United States Patent
Woo et al.

(10) Patent No.: US 9,466,604 B2
(45) Date of Patent: Oct. 11, 2016

(54) METAL SEGMENTS AS LANDING PADS AND LOCAL INTERCONNECTS IN AN IC DEVICE

(71) Applicant: GLOBALFOUNDRIES Inc., Grand Cayman (KY)

(72) Inventors: Youngtag Woo, San Ramon, CA (US); Myungjun Lee, Albany, NY (US); Ryan Ryoung-Han Kim, Albany, NY (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 69 days.

(21) Appl. No.: 14/540,724

(22) Filed: Nov. 13, 2014

(65) Prior Publication Data

US 2016/0141291 A1    May 19, 2016

(51) Int. Cl.
| | |
|---|---|
| *H01L 29/66* | (2006.01) |
| *H01L 21/82* | (2006.01) |
| *H01L 27/11* | (2006.01) |
| *H01L 27/02* | (2006.01) |
| *H01L 23/522* | (2006.01) |
| *H01L 23/528* | (2006.01) |

(52) U.S. Cl.
CPC ....... *H01L 27/1104* (2013.01); *H01L 23/5226* (2013.01); *H01L 23/5286* (2013.01); *H01L 27/0207* (2013.01)

(58) Field of Classification Search
CPC .......... H01L 29/66795; H01L 29/785; H01L 29/4238; H01L 29/0696; H01L 21/823481; H01L 21/76232; H01L 21/82378; H01L 21/84
USPC .......................................... 257/401; 438/294
See application file for complete search history.

(56) References Cited

U.S. PATENT DOCUMENTS

| 9,111,907 B2* | 8/2015 | Kamineni | ......... H01L 29/41791 |
| 9,240,413 B2* | 1/2016 | Smayling | .......... H01L 21/28518 |

* cited by examiner

*Primary Examiner* — Monica D Harrison
(74) *Attorney, Agent, or Firm* — Dittavong & Steiner, P.C.

(57) ABSTRACT

Methods for utilizing metal segments of an additional metal layer as landing pads for vias and also as local interconnects between contacts in an IC device and resulting devices are disclosed. Embodiments include forming source/drain and gate contacts connected to transistors on a substrate in an integrated circuit device, each contact having an upper surface with a first area; forming metal segments in a plane at the upper surface of the contacts, each metal segment being in contact with one or more of the contacts and having a second area greater than the first area; and forming one or more vias between one or more of the metal segments and one or more first segments of a first metal layer.

20 Claims, 6 Drawing Sheets

BACKGROUND

BACKGROUND

METAL SEGMENTS AS LANDING PADS AND LOCAL INTERCONNECTS IN AN IC DEVICE

TECHNICAL FIELD

The present disclosure relates generally to designing and fabricating integrated circuit (IC) devices. The present disclosure is applicable to connections between vias and contacts and to local interconnects between contacts in an IC device, particularly for 7 nanometer (nm) technology nodes and beyond.

BACKGROUND

Generally, an IC device may include various square contacts that are connected to one or more transistors. Additionally, the IC device may include a plurality of metal layers that may be utilized to connect the contacts to various signal sources or targets. In some instances, vias may be utilized to connect an upper metal layer to one or more of the contacts. For example, a via may be utilized to connect a segment of a metal-one (M1) layer to a gate contact on a transistor. However, in some instances, a via may not be substantially aligned with the small square surface area of a target contact, which may cause unreliable connection (e.g., a small contact area) between the via and the target contact. Hence, an unreliable connection between the target contact and the segment of the upper M1 layer results, which may cause the device to be unable to function properly or pass certain IC manufacturing quality/reliability tests, which in turn could negatively impact the manufacturing yield of the IC devices. Additionally, layout of certain metal layers in the IC device may impact advancements in node scaling technologies of the IC devices.

FIGS. 1A and 1B are cross-sectional and three-dimensional diagrams, respectively, of an example IC device. Adverting to FIG. 1A, a cross-section of a conventional static random access memory (SRAM) device is illustrated, which includes a silicon substrate 101 and a shallow trench insulating layer 103. Additionally, on the upper surface of the silicon substrate 101 are a plurality of gate electrodes (PC) 105 and a plurality of trench silicides (TS) 107, wherein gate contacts (CB) 109 connect to upper surfaces of PCs 105, and source/drain contacts (CA) 111 connect to upper surfaces of TS's 107. Further, vias 113 connect one or more segments of an M1 layer 115 to upper surfaces of CB contacts 109 and/or CA contacts 111. However, the bottom surface of a via, for example via 113a, may not be completely aligned with an upper surface of a CB contact, e.g. contact 109a (or other CA or CB contacts), which may result in an insufficient contact area for reliable functionality and a proper transfer of power or signals between the two elements.

FIG. 1B illustrates a 3D diagram of the IC device in FIG. 1A where the via 113a is horizontally misaligned with the CB contact 109a. The misalignment between via 113a and CB contact 109a is merely exemplary; many more instances of misalignment may exist in an IC device between vias and both CB contacts and CA contacts. As noted, among considerations in designing and fabricating IC devices are steps for providing sufficient and efficient contact layout designs for providing reliable and economical manufacturing yields of the IC devices.

A need therefore exists for a methodology enabling improved connections between contacts and vias in an IC device and the resulting device.

SUMMARY

An aspect of the present disclosure is an IC device that utilizes metal segments of an additional metal layer as landing pads for vias and also as local interconnects between contacts.

Another aspect of the present disclosure is a method for utilizing metal segments of an additional metal layer as landing pads for vias and also as local interconnects between contacts in an IC device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming source/drain and gate contacts connected to transistors on a substrate in an integrated circuit device, each contact having an upper surface with a first area; forming metal segments in a plane at the upper surface of the contacts, each metal segment being in contact with one or more of the contacts and having a second area greater than the first area; and forming one or more vias between one or more of the metal segments and one or more first segments of a first metal layer.

Another aspect includes forming one or more local connections between one or more of the metal segments and one or more of the source/drain and gate contacts. Some aspects include forming second segments of a second metal layer perpendicular to the gate contact and the one or more first segments of the first metal layer.

Another aspect includes forming vias connecting one or more of the metal segments or one or more of the first segments of the first metal layer to the second metal layer. In one aspect, the method includes forming first and second interlayer dielectric (ILD) layers; forming the vias through the ILD layers; and forming the metal segments and the first metal layer in the first ILD layer, and the second metal layer in the second ILD layer.

Further aspects include connecting one or more of the second segments of the second metal layer to a power layer, a ground layer, and a bit line. Additional aspects include forming the metal segments based on process variation (PV) bands including an inner edge and an outer edge. In one aspect, the PV bands of adjacent metal segments are separated by a threshold distance.

Another aspect of the present disclosure includes a device including: source/drain and gate contacts connected to transistors on a substrate in an integrated circuit device, each contact having an upper surface with a first area; metal segments in a plane at the upper surface of the contacts, each metal segment being in contact with one or more of the contacts and having a second area greater than the first area; and one or more vias between one or more of the metal segments and one or more first segments of a first metal layer.

In some aspects of the device, one or more of the metal segments form one or more local interconnects with one or more of the source/drain and gate contacts. Other aspects of the device include second segments of a second metal layer perpendicular to the gate contact and the one or more first segments of the first metal layer. One aspect of the device includes vias connecting one or more of the metal segments or one or more of the first segments of the first metal layer to the second metal layer.

Further aspects of the device include first and second ILD layers, wherein the vias are through the ILD layers, and wherein the metal segments and the first metal layer are in the first ILD layer, and the second metal layer is in the second ILD layer. Some aspects of the device include one or more of the second segments of the second segments of the second metal layer that are connected to a power layer, a ground layer, and a bit line. One aspect of the device includes the metal segments that are based on PV bands that include an inner edge and an outer edge. In additional aspects of the device, the PV bands of adjacent metal segments are separated by a threshold distance.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of misalignment between vias and contact surfaces in an IC device. The present disclosure addresses and solves such problems, for instance, by, inter alia, utilizing metal segments of an additional metal layer as landing pads for vias and also as local interconnects between contacts in an IC device.

Figure 1A:
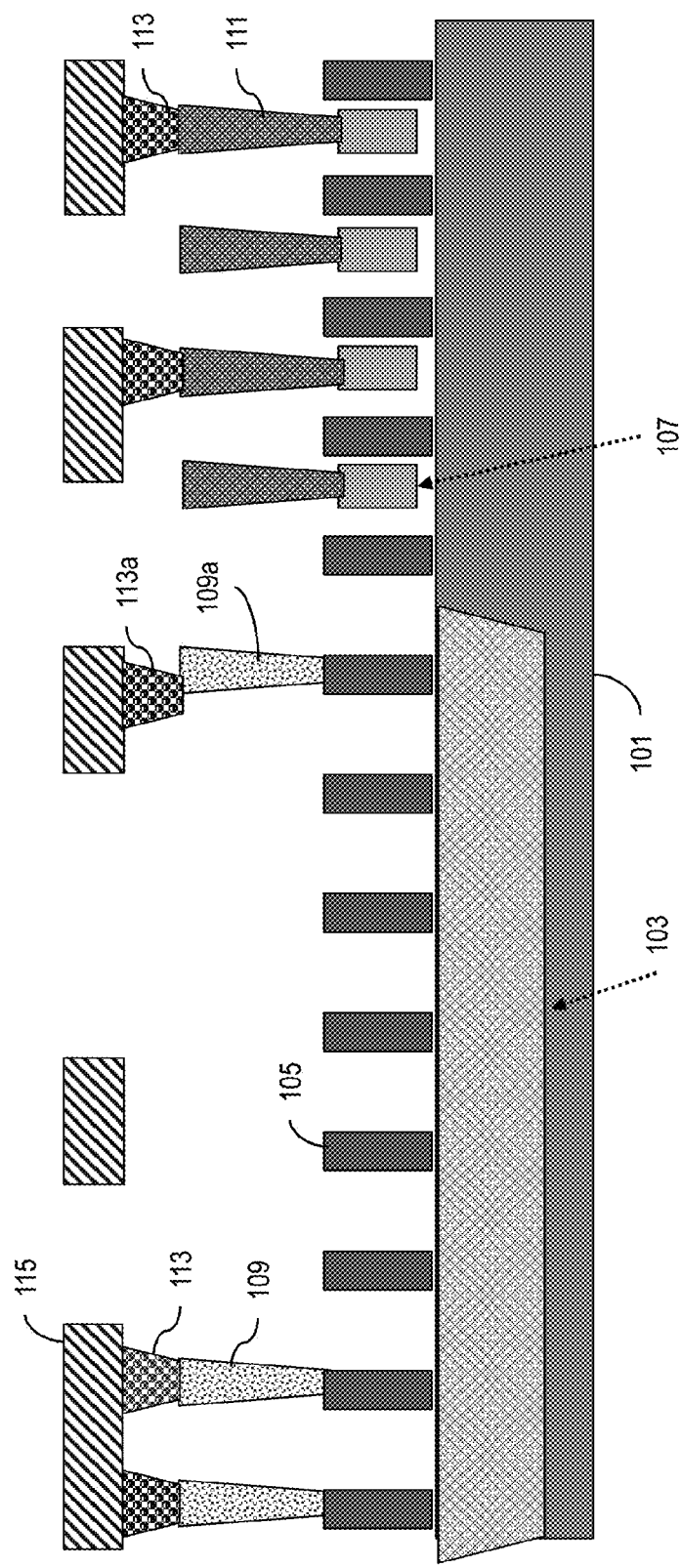
FIGS. 1A and 1B are cross-sectional and three-dimensional (3D) diagrams, respectively, of an example IC device.
Figure 1B:
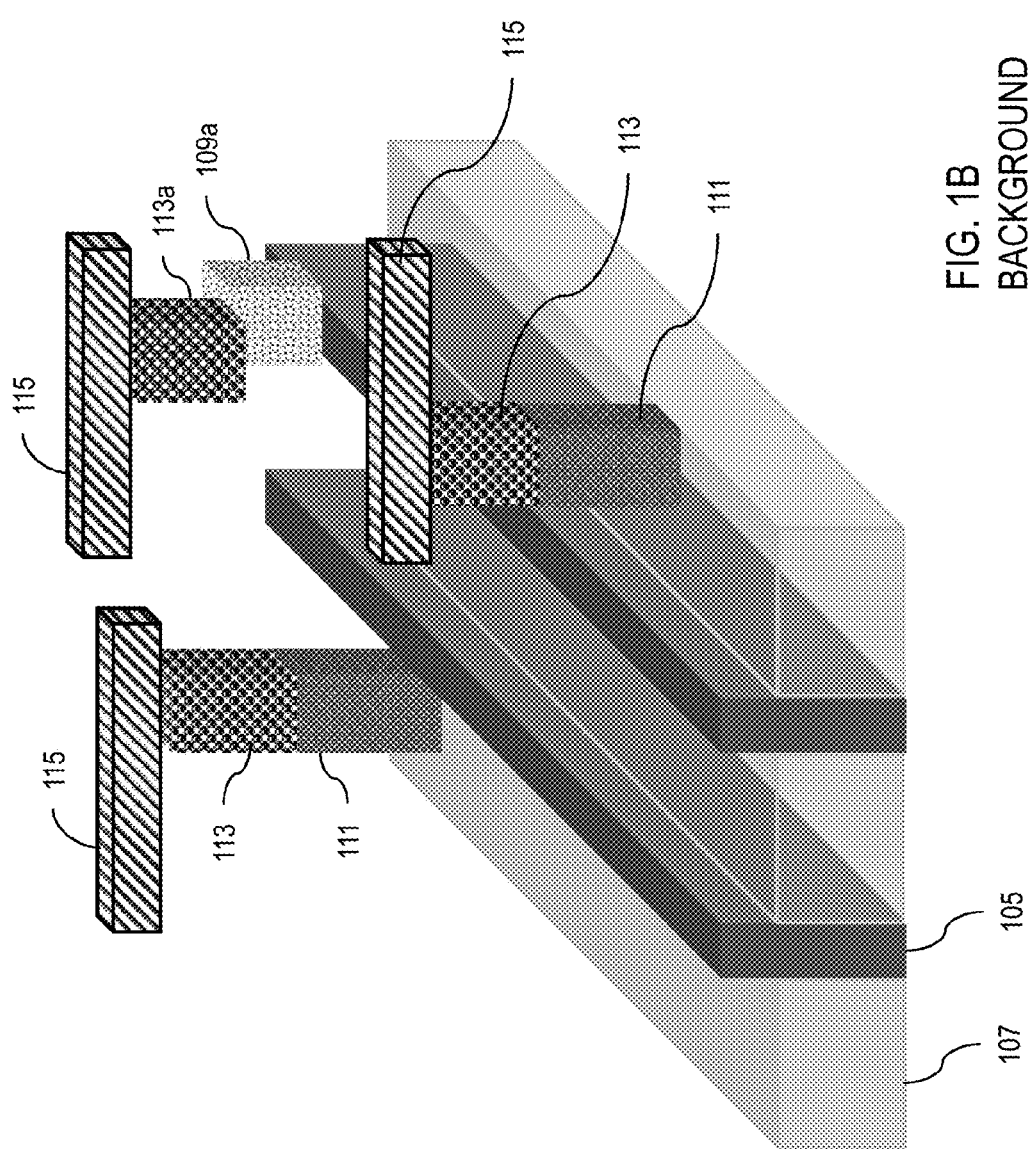
Figure 2A:
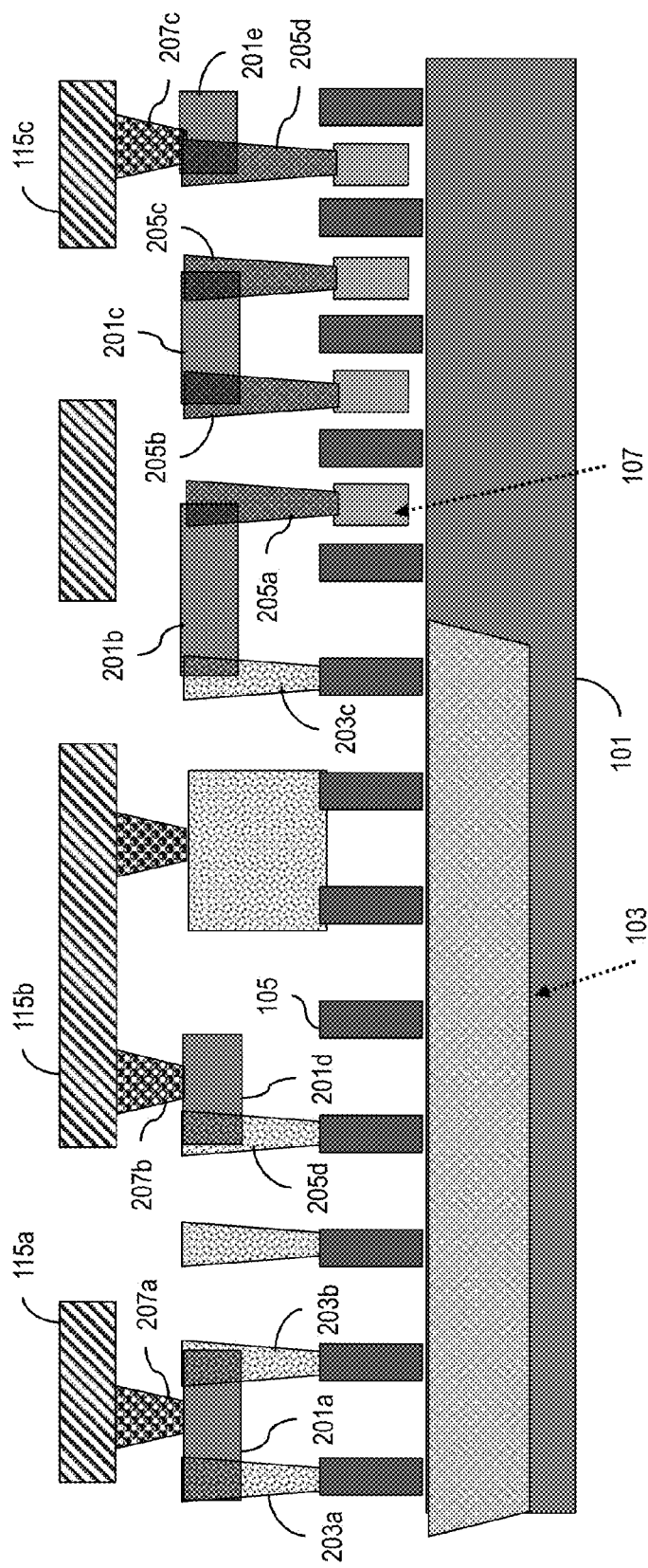
FIGS. 2A, 2B, and 2C are cross-sectional, three-dimensional (3D), and layout diagrams, respectively, of an IC device utilizing metal segments of an additional metal layer, in accordance with an exemplary embodiment.

FIG. 2A illustrates a cross sectional view of an IC device where a plurality of metal segments, for example 201a through 201e, of an additional metal layer, e.g., a metal-zero (M0) layer, which may be implemented in middle-of-line (MOL) IC fabrication processes. Although only five segments are illustrated, the number of segments is merely exemplary. The plurality of metal segments 201a through 201e of the M0 layer may be utilized to provide local interconnections between two or more CB contacts 203a through 203d and/or two or more CA contacts 205a through 205d in the IC device. For example, M0 metal segment 201a interconnects CB contacts 203a and 203b, M0 metal segment 201b interconnects CB contact 203c and CA contact 205a, and M0 metal segment 201c interconnects CA contacts 205b and 205c. Additionally, the M0 metal segments 201a through 201e may provide landing pads for vias 207a through 207c. In addition, an interconnecting M0 metal segment 201 may also provide a landing pad for a via 207 that may be connected to another metal layer. For example, in addition to providing a local interconnection, the M0 metal segment 201a provides a landing pad for via 207a, which is connected to a segment 115a of the M1 layer 115. In another example, M0 metal segment 201d is connected to CB contact 205d and provides a landing pad for via 207b (e.g., the via and the CB contact are not horizontally aligned), which is connected to a metal segment 115b of the M1 layer. In another example, M0 metal segment 201e is connected to CA contact 205d and provides a landing pad for via 207c, which is connected to segment 115c of the M1 layer, as via 207c and CA contact 205d are only partially aligned. Like the M0 segments, the number of CA contacts, CB contacts, vias, and M1 segments shown in FIG. 2A is merely exemplary.

Figure 2B:
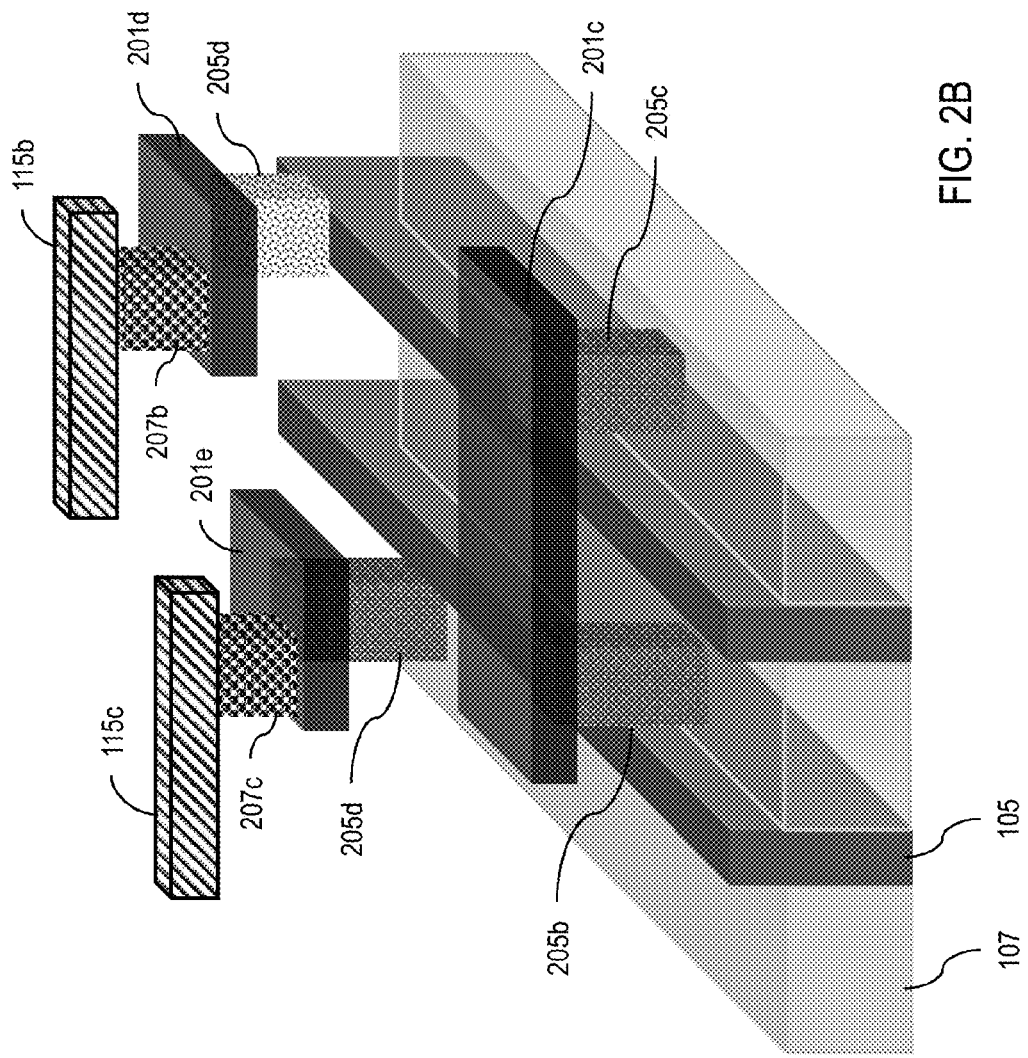

FIG. 2B illustrates a 3D view of some of the connections discussed in FIG. 2A where, for example, the M0 metal segment 201c interconnects CA contacts 205b and 205c, the M0 metal segment 201d is connected to the CB contact 205d and provides a landing pad for the via 207b, and the M0 metal segment 201e is connected to CA contact 205d and provides a landing pad for the via 207c.

Figure 2C:
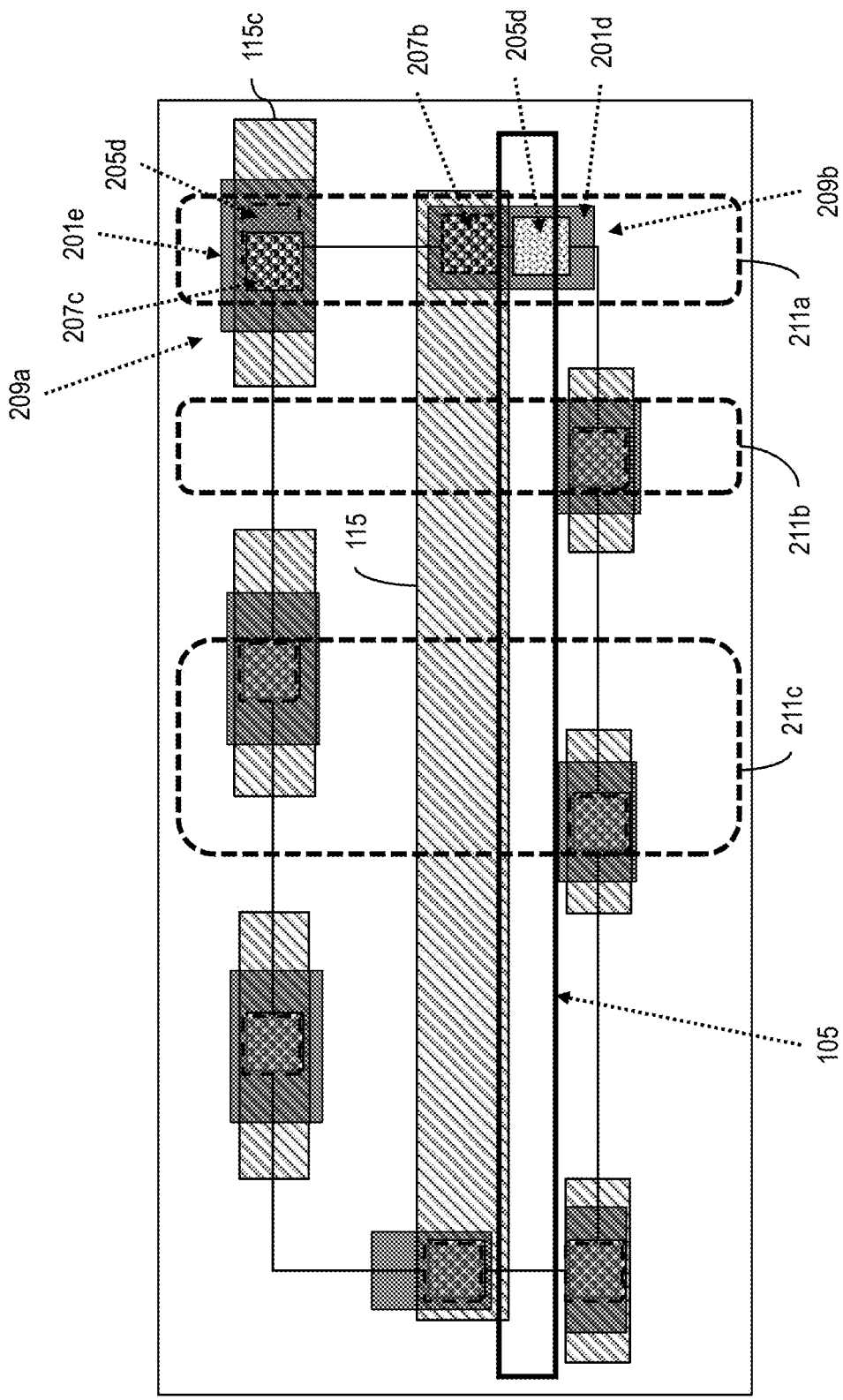

FIG. 2C illustrates a top view of an example layout diagram of the IC device in FIG. 2A, wherein the layout may include a plurality of contact points 209a and 209b. The layout diagram includes a contact point 209a where a metal segment 211a of the M2 layer, the metal segment 115c of the M1 layer, the via 207c, the CA contact 205d, and the metal segment 201e of the M0 layer are interconnected. The via 207c and the CA contact 205d are misaligned, wherein the metal segment 201e is connected to the CA contact 205d and provides additional surface area (e.g., wider upper surface at CA contact 205d) for connecting with the via 207c. In another contact point 209b, the M0 metal segment 201d is connected to the CB contact 205d, which is connected to a PC 105. The metal segment 201d also provides a complete landing pad for the via 207b. In an SRAM device, metal segments of the M2 layer (e.g. 211a through 211c) may be oriented perpendicular to the PCs 105, wherein the M2 metal segments may provide connectivity to one or more power or signal sources. For example, the M2 metal segment 211a may provide connectivity to a negative terminal (Vss) of a power supply, segment 211b may provide connectivity to a bit select line, and segment 211c may provide connectivity to a positive terminal (Vcc) of the power supply. In terms of layout, M0 does not need an enclosure rule around contacts CA and CB because it merely extends the CA and CB area. Therefore, M0 will not impose a rule that potentially increases chip area.

Figure 2D:
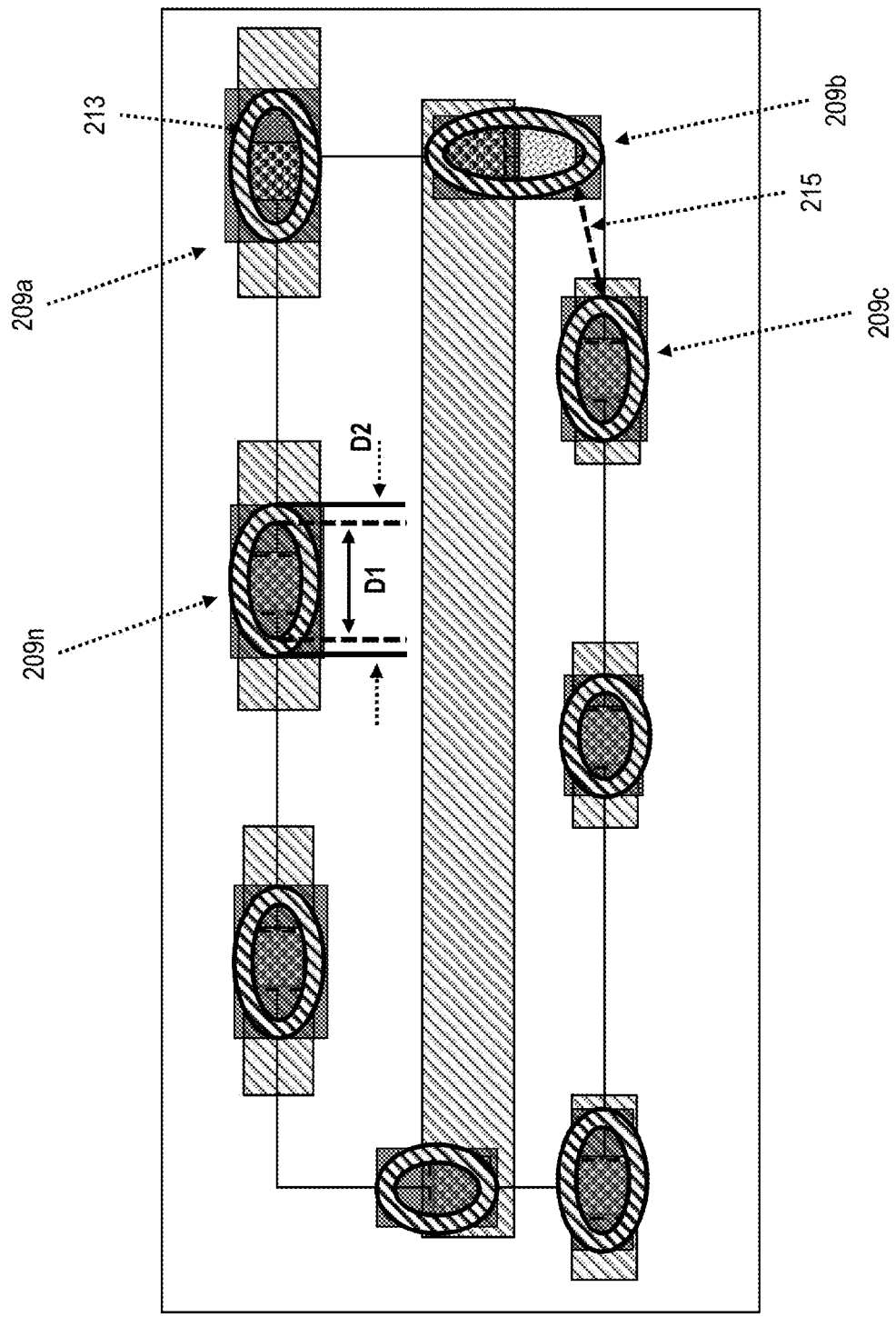
FIG. 2D illustrates a layout diagram including contact points and associated process variation bands in an IC device, in accordance with an exemplary embodiment.

In FIG. 2D, each instance of a contact point 209a through 209n is associated with a PV band that includes an inner edge D1 and an outer edge D2. The PV bands may indicate a range of minimum and maximum dimensions of an object that is to be printed onto an IC substrate. Additionally, routing/placement of neighboring contact points, for example, 209b and 209c, may be based on a threshold distance 215 between the neighboring contact points.

The embodiments of the present disclosure can achieve several technical effects, including improved connections between vias and contacts without increasing chip area by utilizing metal segments of an additional metal layer as landing pads for vias and also as local interconnects between contacts in an IC device. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 7 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming source/drain and gate contacts connected to transistors on a substrate in an integrated circuit device, each contact having an upper surface with a first area;
    forming metal segments in a plane at the upper surface of the contacts, each metal segment being in contact with one or more of the contacts and having a second area greater than the first area; and
    forming one or more vias between one or more of the metal segments and one or more first segments of a first metal layer.

2. The method according to claim 1, further comprising:
    forming one or more local connections between one or more of the metal segments and one or more of the source/drain and gate contacts.

3. The method according to claim 1, further comprising:
    forming second segments of a second metal layer perpendicular to the gate contact and the one or more first segments of the first metal layer.

4. The method according to claim 3, further comprising:
    forming vias connecting one or more of the metal segments or one or more of the first segments of the first metal layer to the second metal layer.

5. The method according to claim 3, further comprising:
    forming first and second interlayer dielectric (ILD) layers;
    forming the vias through the ILD layers; and
    forming the metal segments and the first metal layer in the first ILD layer, and the second metal layer in the second ILD layer.

6. The method according to claim 3, further comprising:
    connecting one or more of the second segments of the second metal layer to a power layer, a ground layer, and a bit line.

7. The method according to claim 1, further comprising:
    forming the metal segments based on process variation (PV) bands including an inner edge and an outer edge.

8. The method according to claim 7, wherein the PV bands of adjacent metal segments are separated by a threshold distance.

9. A device comprising:
    source/drain and gate contacts connected to transistors on a substrate in an integrated circuit device, each contact having an upper surface with a first area;
    metal segments in a plane at the upper surface of the contacts, each metal segment being in contact with one or more of the contacts and having a second area greater than the first area; and
    one or more vias between one or more of the metal segments and one or more first segments of a first metal layer.

10. The device according to claim 9, wherein one or more of the metal segments form one or more local interconnects with one or more of the source/drain and gate contacts.

11. The device according to claim 9, further comprising:
    second segments of a second metal layer perpendicular to the gate contact and the one or more first segments of the first metal layer.

12. The device according to claim 11, further comprising:
    vias connecting one or more of the metal segments or one or more of the first segments of the first metal layer to the second metal layer.

13. The device according to claim 11, further comprising:
    first and second interlayer dielectric (ILD) layers, wherein the vias are through the ILD layers, and wherein the metal segments and the first metal layer are in the first ILD layer, and the second metal layer is in the second ILD layer.

14. The device according to claim 11, wherein one or more of the second segments of the second segments of the second metal layer are connected to a power layer, a ground layer, and a bit line.

15. The device according to claim 9, wherein the metal segments are based on process variation (PV) bands that include an inner edge and an outer edge.

16. The device according to claim 15, wherein the PV bands of adjacent metal segments are separated by a threshold distance.

17. A method comprising:
    forming source/drain and gate contacts connected to transistors on a substrate in an integrated circuit device, each contact having an upper surface with a first area;
    forming metal segments in a plane at the upper surface of the contacts, each metal segment being in contact with one or more of the contacts and having a second area greater than the first area;
    forming one or more vias between one or more of the metal segments and one or more first segments of a first metal layer;
    forming one or more local connections between one or more of the metal segments and one or more of the source/drain and gate contacts;

forming second segments of a second metal layer perpendicular to the gate contact and the one or more first segments of the first metal layer; and connecting one or more of the second segments of the second metal layer to a power layer, a ground layer, and a bit line.

18. The method according to claim 17, further comprising:

forming vias connecting one or more of the metal segments or one or more of the first segments of the first metal layer to the second metal layer.

19. The method according to claim 17, further comprising:

forming first and second interlayer dielectric (ILD) layers;
forming the vias through the ILD layers; and
forming the metal segments and the first metal layer in the first ILD layer, and the second metal layer in the second ILD layer.

20. The method according to claim 17, further comprising:

forming the metal segments based on process variation (PV) bands including an inner edge and an outer edge, wherein the PV bands of adjacent metal segments are separated by a threshold distance.

* * * * *